United States Patent
Cho et al.

(10) Patent No.: US 6,496,072 B2
(45) Date of Patent: Dec. 17, 2002

(54) AMPLIFYING APPARATUS FOR A MOBILE STATION RECEIVER AND METHOD FOR CONTROLLING THE SAME

(75) Inventors: Seung-Ki Cho; Yong-Seong Jeong, both of Seoul; Sang-Yong Yang, Yongin-shi; Woo-Yong Lee; Jae-Min Lee, both of Songnam-shi, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/752,707

(22) Filed: Dec. 28, 2000

(65) Prior Publication Data

US 2001/0015675 A1 Aug. 23, 2001

(30) Foreign Application Priority Data

Dec. 29, 1999 (KR) .............................. 99-65240

(51) Int. Cl.[7] .............................. H03G 3/10; H03F 3/04; H01P 1/22
(52) U.S. Cl. ...................... 330/284; 330/302; 333/81 R
(58) Field of Search ................................ 330/284, 302; 333/81 R

(56) References Cited

U.S. PATENT DOCUMENTS 4,684,881 A * 8/1987 Diller et al. .............. 333/81 R
5,351,030 A * 9/1994 Kobayashi et al. ........ 333/81 R
5,877,612 A * 3/1999 Straw ......................... 330/254

* cited by examiner

Primary Examiner—Patricia Nguyen
(74) Attorney, Agent, or Firm—Dilworth & Barrese, LLP

(57) ABSTRACT

An amplifying apparatus for a mobile station receiver is disclosed. A low-noise amplifier amplifies a received signal to a preset level. A controller detects a level of a signal corresponding to a first frame of the received signal output from the low-noise amplifier, and generates a control voltage according to the detected level. An attenuation determining resistor determines an attenuation of the received signal. A first switching element is connected in series to the attenuation determining resistor, and is turned ON according to the control voltage so as to attenuate the received signal through the attenuation determining resistor. An impedance compensation resistor is connected in parallel to the attenuation determining resistor, and compensates for a decrease in an impedance due to turn-ON of the first switching element. Further, a second switching element is connected in parallel to the impedance compensation resistor and the first switching element. The second switching element is turned ON according to the control voltage so as to provide the received signal to the low-noise amplifier without attenuation.

10 Claims, 4 Drawing Sheets

US 6,496,072 B2

AMPLIFYING APPARATUS FOR A MOBILE STATION RECEIVER AND METHOD FOR CONTROLLING THE SAME

PRIORITY

This application claims priority to an application entitled "Amplifying Apparatus for a Mobile Station Receiver and Method for Controlling the Same" filed in the Korean Industrial Property Office on Dec. 29, 1999 and assigned Serial No. 99-65240, the contents of which are hereby incorporated by reference.

BACKGROUND OF THE INVENTION

1. Field of the Invention

The present invention relates generally to a mobile station, and in particular, to an amplifying apparatus for securing a good impedance match of a mobile station receiver and a method for controlling the same.

2. Description of the Related Art

FIG. 1 is a circuit diagram illustrating a conventional amplifying apparatus.

Referring to FIG. 1, a CDMA (Code Division Multiple Access) mobile station receives a radio signal through an antenna 110 and provides the received signal to a receiver through a duplexer 109. In the receiver, the received signal is provided to a low-noise amplifier (LNA) 108 through capacitors 107 and 108. The low-noise amplifier 108 amplifies the received signal and provides the amplified signal to a controller (not shown). When the signal output from the low-noise amplifier 108 is higher than or equal to a predetermined level, the controller generates a control voltage Vcont of a first level (e.g., 3V) to attenuate (or decrease) the level of the received signal.

The control voltage Vcont generated by the controller is provided to a base of a bipolar junction transistor (BJT) 111. The BJT 111 is turned ON in response to the control voltage Vcont at the first level. Then, the power supply voltage VCC is provided to a diode 101 in the receiver through resistors 102 and 103. As a result, the diode 101 becomes conductive (or is turned ON), so that the received signal being provided from the duplexer 109 to the receiver is attenuated by the circuit comprised of the resistor 102, the capacitor 105 and the resistor 103.

However, as the diode 101 is turned ON, an impedance of the amplifying apparatus is decreased as compared with the case where the diode 101 is turned OFF. As a result, the impedance of the amplifying apparatus is not matched with an output impedance of the low-noise amplifier 108. Hence, the filtering characteristics of a filter in the receiver is degraded due to the signal output from the low-noise amplifier 108. Further, because of the impedance mismatch, abnormal oscillation occurs and the output signal includes ripple components, so that the demodulated signal may have errors.

SUMMARY OF THE INVENTION

It is, therefore, an object of the present invention to provide an amplifying apparatus for securing a good impedance match of a mobile station receiver and a method for controlling the same.

It is another object of the present invention to provide an amplifying apparatus for removing ripple components from the output signal.

To achieve the above and other objects, there is provided an amplifying apparatus for a mobile station receiver. In the amplifying apparatus, a low-noise amplifier amplifies a received signal to a preset level. A controller detects a level of a signal corresponding to a first frame of the received signal output from the low-noise amplifier, and generates a control voltage according to the detected level. An attenuation determining resistor determines an attenuation of the received signal. A first switching element is connected in series to the attenuation determining resistor, and is turned ON according to the control voltage so as to attenuate the received signal through the attenuation determining resistor. An impedance compensation resistor is connected in parallel to the attenuation determining resistor, and compensates for a decrease in an impedance due to turn-ON of the first switching element.

Further, a second switching element is connected in parallel to the impedance compensation resistor and the first switching element. The second switching element is turned ON according to the control voltage so as to provide the received signal to the low-noise amplifier without attenuation.

Preferably, the control voltage is at a first level when the level of the signal corresponding to the first frame of the received signal output through the low-noise amplifier is higher than or equal to a threshold level. The control voltage is at a second level when the level of the signal corresponding to the first frame is lower than the threshold level.

Preferably, when the control voltage is at the first level, the first switching element is turned ON and the second switching element is turned OFF. When the control voltage is at the second level, the first switching element is turned OFF and the second switching element is turned ON.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
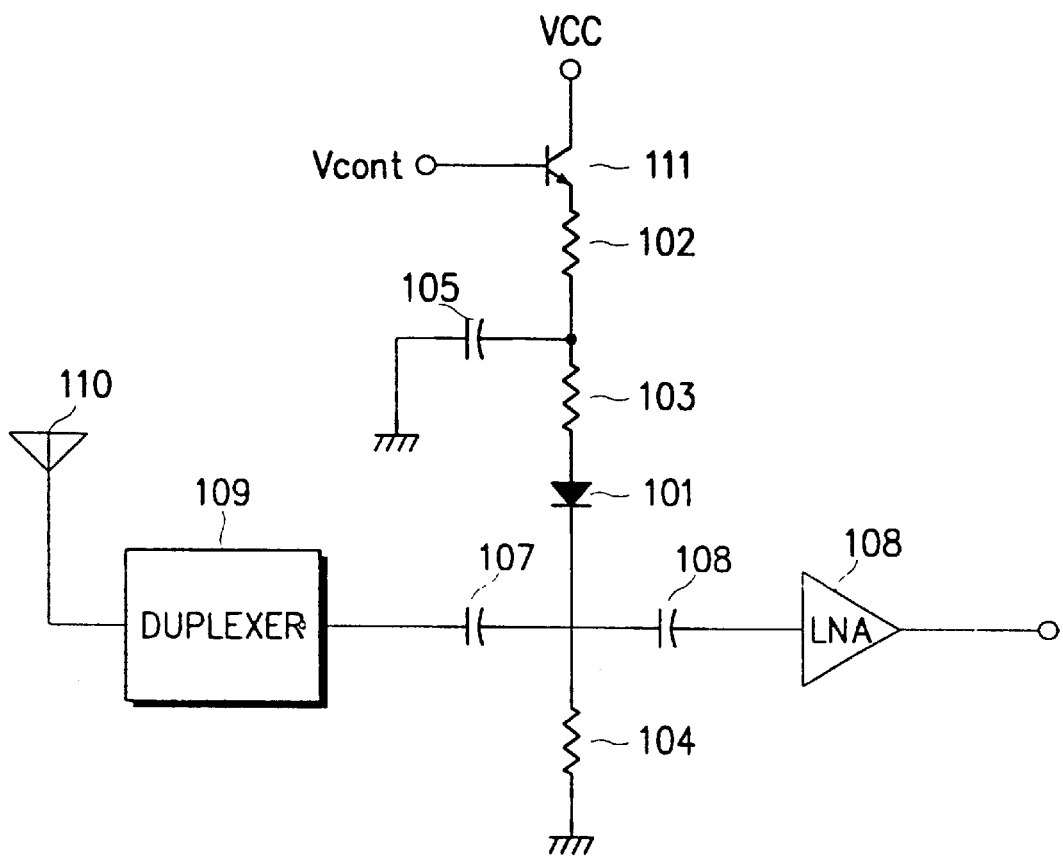
FIG. 1 is a circuit diagram illustrating a conventional amplifying apparatus.
Figure 2:
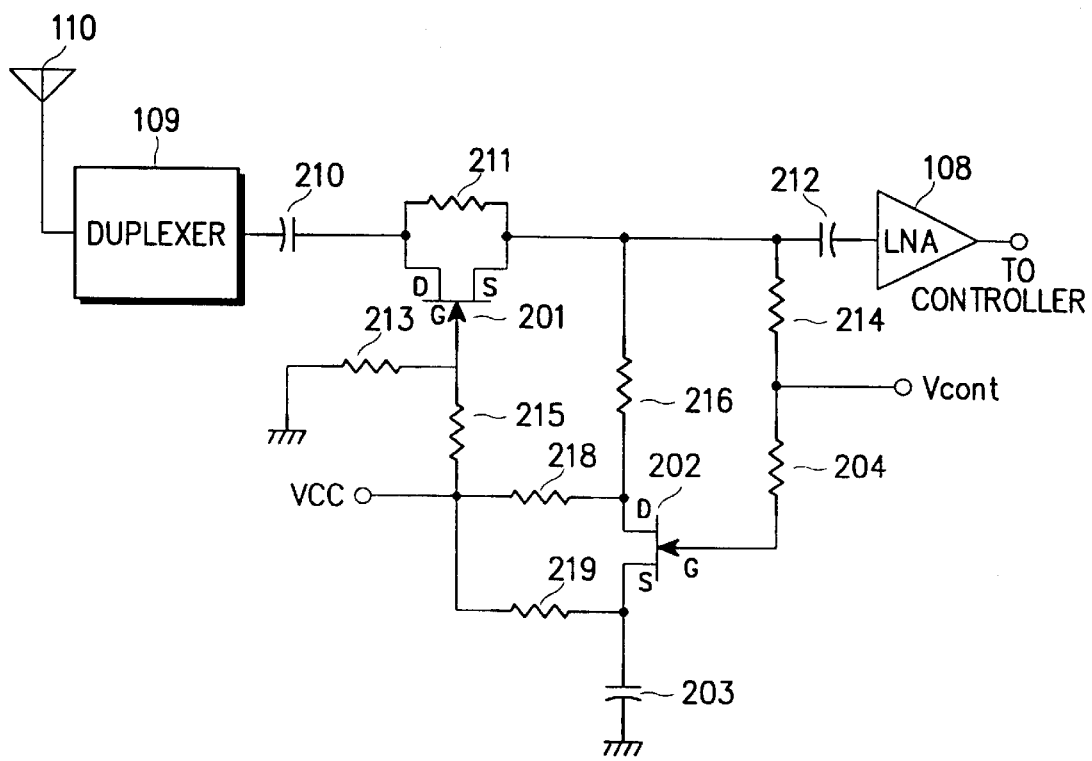
FIG. 2 is a circuit diagram illustrating an amplifying apparatus according to an embodiment of the present invention.

FIG. 2 shows an amplifying apparatus according to an embodiment of the present invention.

Referring to FIG. 2, a signal received through an antenna 110 is provided to a receiver of the mobile station through a duplexer 109. The power supply voltage VCC is equally provided to a drain and a source of a field effect transistor (FET) 202, which is a first switching element, through resistors 218 and 219, respectively. Further, the power supply voltage VCC divided by resistors 213 and 215 is provided to a gate of an FET 201, which is a second switching element. The gate-source bias voltage of the FET 201 is set to a predetermined voltage of, for example, below 0.8V.

As the bias voltage is provided to the FET 201, the received signal is provided to a low-noise amplifier 108 through capacitors 210 and 212, and the low-noise amplifier 108 amplifies the received signal and provides the amplified signal to a controller (not shown). The controller determines a level of the received signal depending on the low-noise-amplified signal corresponding to a first frame of the received signal. When the level of the received signal output from the low-noise amplifier 108 is higher than or equal to a predetermined level, the controller generates a control voltage Vcont of a first level (e.g., 3V).

When provided with the control voltage Vcont of the first level, the FET 202 has a gate-source voltage of 0V (i.e., an active LOW voltage). Thus, the FET 202 is turned ON and the gate-source voltage of the FET 201 becomes lower than a threshold voltage (Vth), so that the FET 201 is turned OFF.

Accordingly, the received signal provided from the duplexer 109 is attenuated by the circuit comprised of the capacitor 210, the resistor 211, the resistor 216, and the capacitor 203. The attenuated received signal is provided to the low-noise amplifier 108 through the capacitor 212. The resistor 211 is an impedance compensation resistor for compensating for a decrease in an impedance of the amplifying apparatus due to turn-ON of the FET 202.

The resistor 216 is a resistor for determining an attenuation of the received signal. That is, the attenuation of the received signal is determined depending on a resistance of the resistor 216.

Meanwhile, if the level of the received signal output from the low-noise amplifier 108 is lower than the predetermined level, the controller generates a control voltage Vcont of a second level (e.g., 0V which is an active LOW voltage). Then, an almost similar voltage is applied to the gate of the FET 201 and the source of the FET 202 by the circuit comprised of the resistors 218, 216, 214, 204 and 219. As a result, a voltage difference between the gate of the FET 201 and the source of the FET 202 becomes between 0V and 0.8V, so that the FET 201 is turned ON. At the moment, the gate-source voltage of the FET 202 becomes lower than a threshold voltage, so that the FET 202 is turned OFF.

Accordingly, the received signal is provided to the low-noise amplifier 108 through the duplexer 109, the capacitor 210, the resistor 211 and the capacitor 212. However, the attenuation of the received signal caused by the resistor 211 is insignificant, so that the received signal applied to the low-noise amplifier 108 is almost equal in level to the original received signal.

Figure 3A:
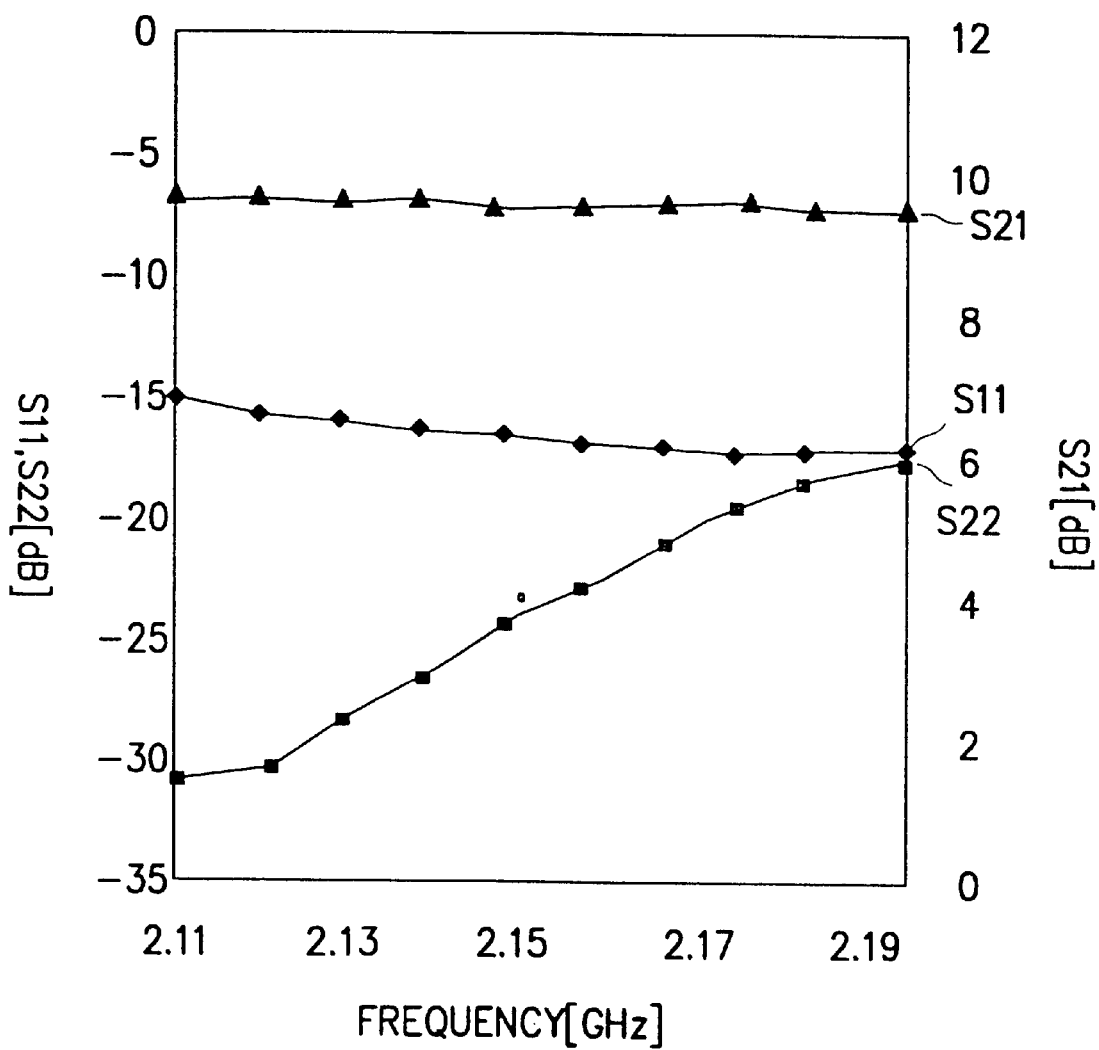
FIG. 3A is a graph illustrating output characteristics of the amplifying apparatus of FIG. 2 when the control voltage Vcont is at a second level.

FIG. 3A is a graph that shows output characteristics of the amplifying apparatus of FIG. 2 when the control voltage Vcont is at the second level.

Referring to FIG. 3A, when the control voltage Vcont is at the second level of 0V (i.e., active LOW), the intact received signal is output through the low-noise amplifier 108 without attenuation. Curve S11 indicates a variation in level of the signal input to the low-noise amplifier 108. Curve S22 indicates a variation in level of the signal attenuated by the amplifying apparatus. Curve S21 indicates a variation in level of the impedance-matched signal output from the low-noise amplifier 108.

Figure 3B:
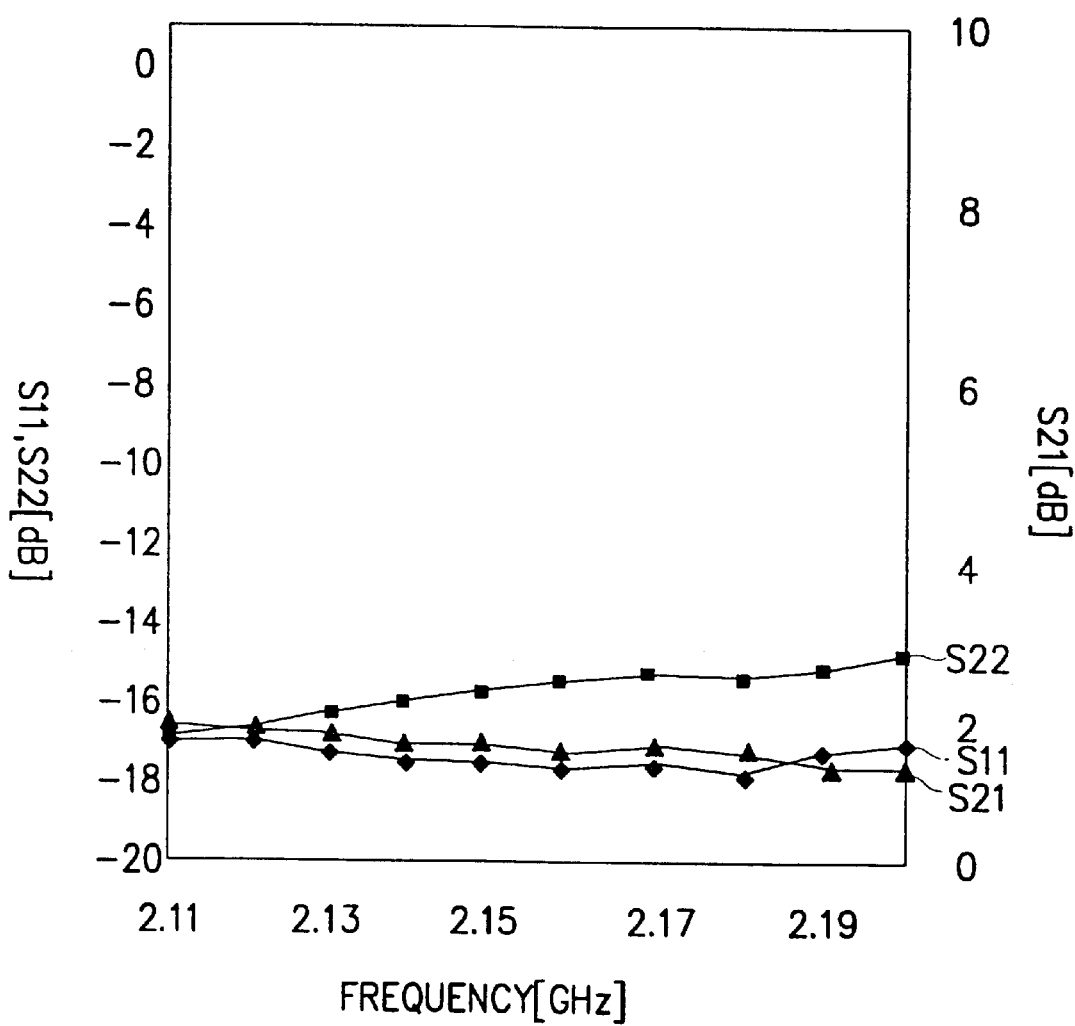
FIG. 3B is a graph illustrating output characteristics of the amplifying apparatus of FIG. 2 when the control voltage Vcont is at a first level.

FIG. 3B is a graph that shows output characteristics of the amplifying apparatus of FIG. 2 when the control voltage Vcont is at the first level.

Referring to FIG. 3B, when the control voltage Vcont is at the first level of 3V (i.e., active HIGH), the intact received signal is output through the low-noise amplifier 108 without attenuation. Curve S11 indicates a variation in level of the signal input to the low-noise amplifier 108. Curve S22 indicates a variation in level of the signal attenuated by the amplifying apparatus. Curve S21 indicates a variation in level of the impedance-matched signal output from the low-noise amplifier 108.

As described above, when a level of the received signal is higher than or equal to a predetermined level, the amplifying apparatus according to the present invention attenuates the received signal while maintaining an impedance match between the input and output signals of the low-noise amplifier, to thereby remove the ripple components which may be included in the frequency component due to the input-output impedance difference. In addition, the novel amplifying apparatus prevents abnormal oscillations which may occur due to the impedance mismatch, thus increasing demodulation performance of the received signal.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. An amplifying apparatus for a mobile station receiver, comprising:
   a low-noise amplifier for amplifying a received signal to a preset level;
   a controller for detecting a level of a signal corresponding to a first frame of the received signal output from the low-noise amplifier, and generating a control voltage according to the detected level;
   an attenuation determining resistor for determining an attenuation of the received signal;
   a first switching element connected in series to the attenuation determining resistor, said first switching element being turned ON according to the control voltage so as to attenuate the received signal through the attenuation determining resistor; and
   an impedance compensation resistor connected in parallel to the attenuation determining resistor, for compensating for a decrease in an impedance due to turn-ON of the first switching element.

2. The amplifying apparatus as claimed in claim 1, further comprising a second switching element connected in parallel to the impedance compensation resistor and the first switching element, said second switching element being turned ON according to the control voltage so as to provide the received signal to the low-noise amplifier without attenuation.

3. The amplifying apparatus as claimed in claim 2, wherein the control voltage is at a first level when the level of the signal corresponding to the first frame of the received signal output through the low-noise amplifier is higher than or equal to a threshold level, and wherein the control voltage is at a second level when the level of the signal corresponding to the first frame is lower than the threshold level.

4. The amplifying apparatus as claimed in claim 3, wherein when the control voltage is at the first level, the first switching element is turned ON and the second switching element is turned OFF, and wherein when the control voltage is at the second level, the first switching element is turned OFF and the second switching element is turned ON.

5. A method for controlling an amplifying apparatus for a mobile station receiver, comprising the steps of:

low-noise amplifying a received signal;

attenuating the received signal by a preset attenuation, when a level of the low-noise amplified signal is higher than or equal to a threshold level; and compensating for a decrease in an impedance caused by attenuation of the received signal.

6. A method for controlling an amplifying apparatus for a mobile station receiver, comprising the steps of:

low-noise amplifying a received signal;

generating a first control voltage, when a level of the low-noise amplified signal is higher than or equal to a threshold level; and attenuating the received signal by a preset attenuation in response to the first control voltage;

compensating for a decrease in an impedance caused by attenuation of the received signal.

7. The method as claimed in claim 6, further comprising the steps of:

generating a second control voltage, when a level of the low-noise amplified signal is lower than the threshold level; and maintaining a level of the received signal without attenuation in response to the second control voltage.

8. An amplifying apparatus for a mobile station receiver, comprising:

an attenuation determining resistor for attenuating of a received signal;

a first switching element connected in series to the attenuation determining resistor, said first switching element being turned ON in response to a first control voltage so as to attenuate the received signal through the attenuation determining resistor, said first control voltage being generated when a level of the low-noise amplified received signal is higher than or equal to a threshold level; and an impedance compensation resistor for compensating for a decrease in an impedance caused by turn-ON of the first switching element.

9. The amplifying apparatus as claimed in claim 8, further comprising a second switching element connected in parallel to the impedance compensation resistor, said second switching element being turned ON in response to a second control voltage so as to provide the received signal to the low-noise amplifier without attenuation, said second control voltage being generated when a level of the low-noise amplified received signal is lower than the threshold level.

10. An amplifying apparatus for a mobile station receiver, comprising:

a low-noise amplifier for amplifying a received signal with a preset gain;

a controller for generating a first control voltage when a level of the received signal corresponding to a first frame of the received signal output through the low-noise amplifier is higher than or equal to a threshold level, and generating a second control voltage when the level of the received signal corresponding to the first frame is lower than the threshold level;

an attenuation determining resistor for determining an attenuation of the received signal;

a first switching element connected in series to the attenuation determining resistor, said first switching element being turned ON in response to the first control voltage so as to attenuate the received signal through the attenuation determining resistor; and an impedance compensation resistor for compensating for a decrease in an impedance caused by turn-ON of the first switching element.

* * * * *